TELLURIUM THIN FILM FIELD EFFECT SOLID STATE ELECTRICAL DEVICES

Filed Feb. 14, 1964

6 Sheets-Sheet 1

INVENTOR.
PAUL K. WEIMER
BY
W. S. Hill
Agent

TELLURIUM THIN FILM FIELD EFFECT SOLID STATE ELECTRICAL DEVICES

Filed Feb. 14, 1964 6 Sheets-Sheet 2

INVENTOR.
PAUL K. WEIMER

BY

W. S. Hill
Agent

Dec. 6, 1966 P. K. WEIMER 3,290,569

TELLURIUM THIN FILM FIELD EFFECT SOLID STATE ELECTRICAL DEVICES

Filed Feb. 14, 1964 6 Sheets-Sheet 3

INVENTOR.
PAUL K. WEIMER
BY
W.S. Hill
Agent

Dec. 6, 1966 P. K. WEIMER 3,290,569

TELLURIUM THIN FILM FIELD EFFECT SOLID STATE ELECTRICAL DEVICES

Filed Feb. 14, 1964 6 Sheets-Sheet 4

INVENTOR.
PAUL K. WEIMER
BY
W. S. Hill
Agent

INVENTOR.
PAUL K. WEIMER
BY
W.S. Hill
Agent

INVENTOR.
PAUL K. WEIMER
BY
W. S. Hill
Agent

United States Patent Office 3,290,569

Patented Dec. 6, 1966

3,290,569
TELLURIUM THIN FILM FIELD EFFECT SOLID STATE ELECTRICAL DEVICES

Paul Kessler Weimer, Princeton, N.J., assignor to Radio Corporation of America, a corporation of Delaware Filed Feb. 14, 1964, Ser. No. 344,921
13 Claims. (Cl. 317—235)

This invention relates to improved solid state electrical devices. More particularly the invention relates to improved thin film field-effect solid state electrical devices.

A type of insulated-gate, field-effect, solid state electrical device known as the TFT (Thin Film Transistor) has been recently described by me. See P. K. Weimer, The TFT—A Thin-Film Transistor, Proc. IRE, vol. 50, page 1462, June 1962. The thin film transistor generally comprises a layer of semiconductive material having at least two spaced electrodes thereon; a thin film of insulating or high resistivity material on at least a portion of the semiconductive layer; and at least one control or gate electrode on the insulating film over at least part of the gap between the two spaced electrodes. The pair of spaced electrodes may be termed anode and cathode electrodes, or source and drain electrodes. The assemblage may be supported by an insulating substrate.

Semiconductive materials which have been suggested for the semiconductive layer in a thin film transistor include elemental semiconductors such as germanium, silicon, and germanium-silicon alloys; III-V semiconductive compounds such as the phosphides, arsenides and antimonides of aluminum, gallium and indium; and II-VI semiconductive compounds such as the sulfides, selenides and tellurides of zinc and cadmium. See, for example, F. V. Shallcross, Cadmium Selenide Thin-Film Transistors, Proc. IEEE, vol. 51, page 851, May 1963.

It is desirable to fabricate improved thin film devices utilizing both P-type and N-type semiconductive materials, so that arrays of complementary devices may be fabricated on a single substrate. It is also desirable to fabricate thin film solid state devices from semiconductive materials having high charge carrier mobility; to fabricate thin film solid state devices utilizing an elemental semiconductor; and to fabricate thin film solid state devices without heating the substrate.

It is an object of this invention to provide improved solid state devices.

Another object is to provide active solid state devices which can be prepared entirely by deposition of thin films upon an insulating substrate or support.

Still another object is to fabricate thin film transistor circuit elements conveniently and inexpensively, for example, by the successive deposition of thin films on a substrate or support.

Still another object is to provide novel and practical solid state devices which can be fabricated as arrays of complementary devices on a single substrate.

Yet another object is to provide improved thin film devices fabricated of a semiconductor having high charge carrier mobility.

But another object is to provide a thin film semiconductive device using a chemical element for the semiconducting layer.

A further object is to provide a thin film semiconductive device which can be fabricated without heating the substrate during the deposition of the semiconductor.

These and other objects are attained according to the invention by providing a solid state electrical device or circuit element comprising a layer of crystalline semiconductive tellurium having at least two spaced electrodes on it. A thin film of an insulating or high resistivity material is deposited in contact with at least a portion of the tellurium layer. The insulating film is preferably less than one micron thick. At least one control electrode is applied to the thin insulating film. The control electrode preferably extends over at least part of the gap between the two spaced electrodes. The assemblage consisting of the tellurium layer, the two spaced electrodes, the insulated film, and the control electrode, may be supported by an insulating substrate or support.

It is a feature of the invention that the tellurium layer utilized is of a single conductivity type, and does not require the fabrication of p-n junctions.

The invention will be described in greater detail by the following examples, considered in conjunction with the accompanying drawing, in which:

FIGURE 1*a* is a cross-sectional view of a solid state device embodying the invention, together with a suitable circuit utilizing the device as an amplifier;

FIGURE 1*b* is a plan view of the device illustrated in FIGURE 1*a*;

Figure 10A:
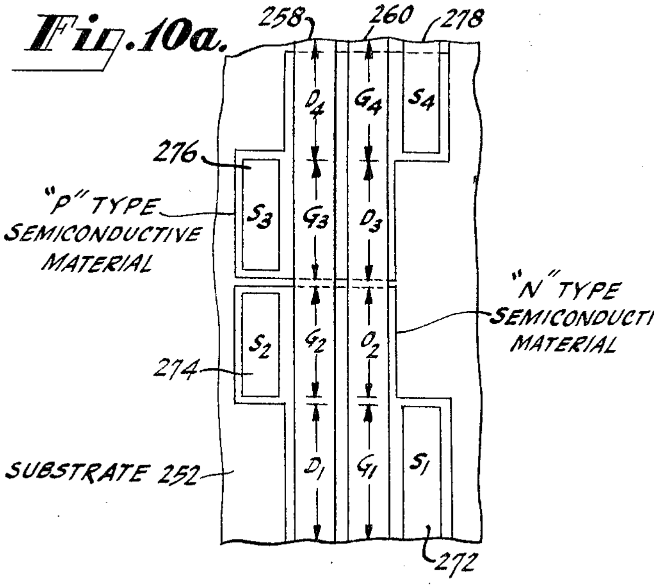
Figure 10B:
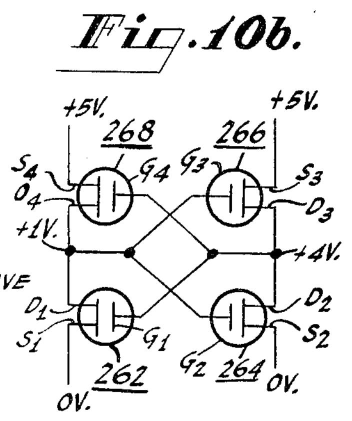
Figure 11:
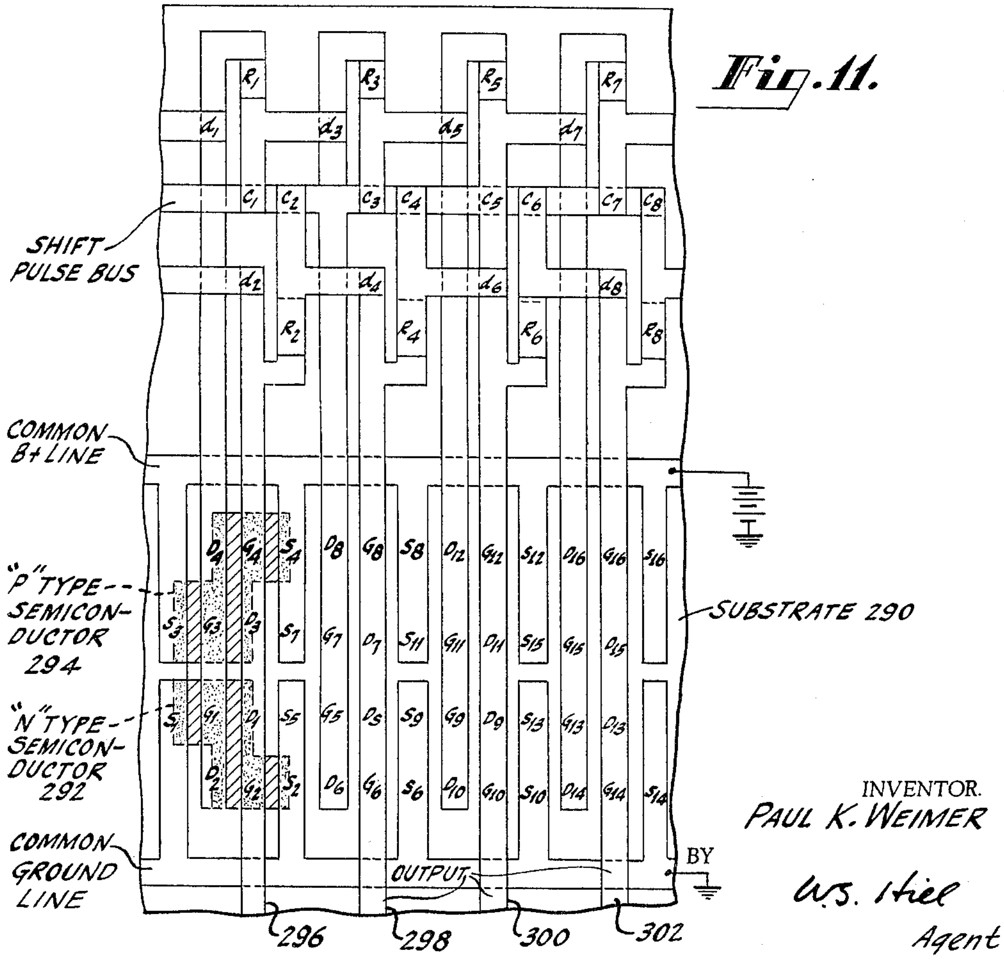
Figure 12:
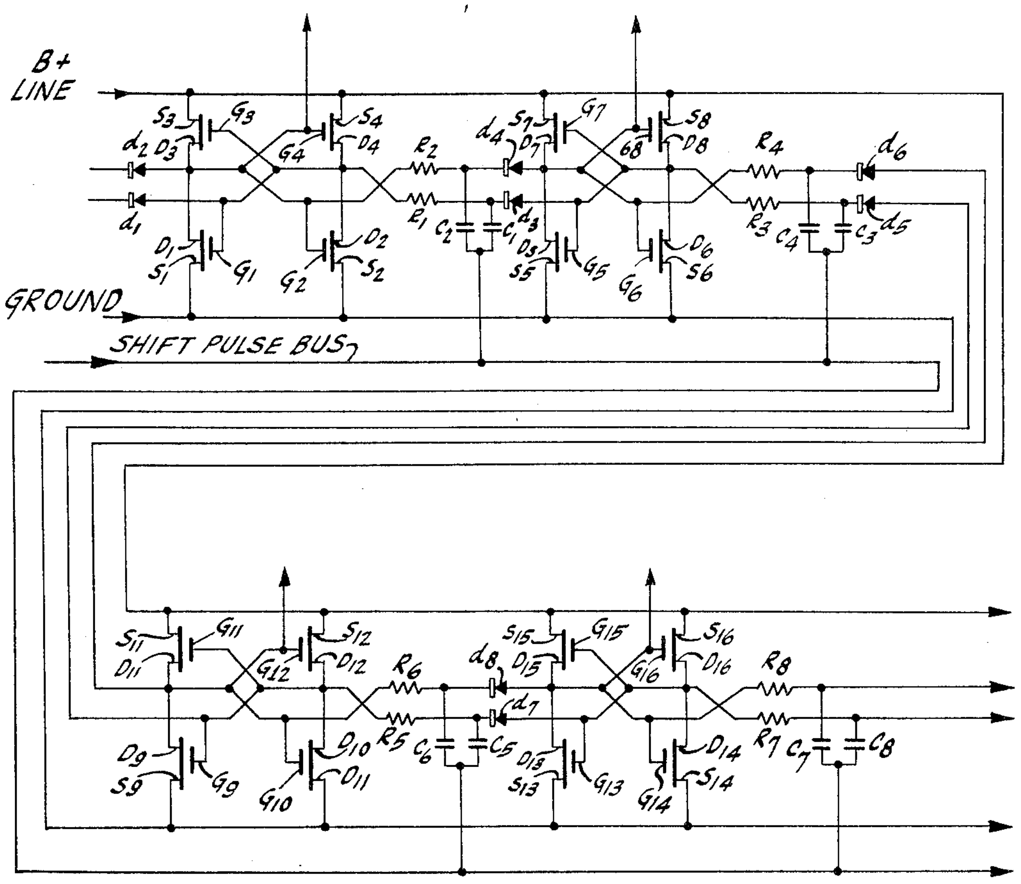
Figure 13:
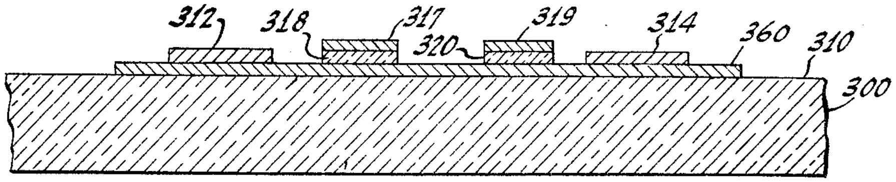
Figure 14:
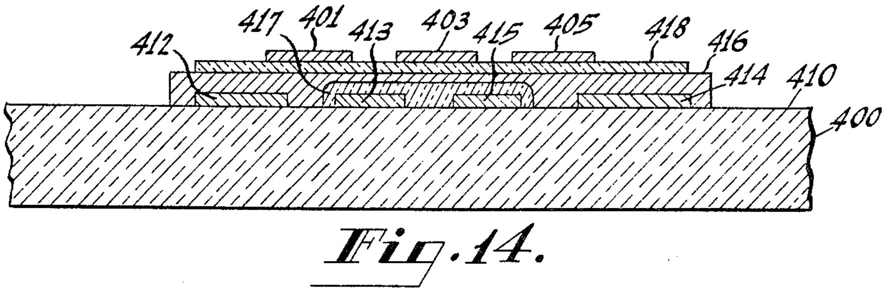
Figure 15A:
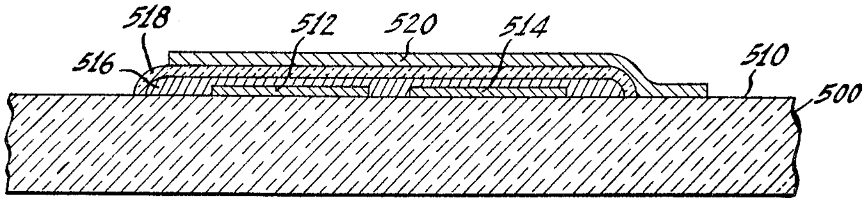
Figure 15B:
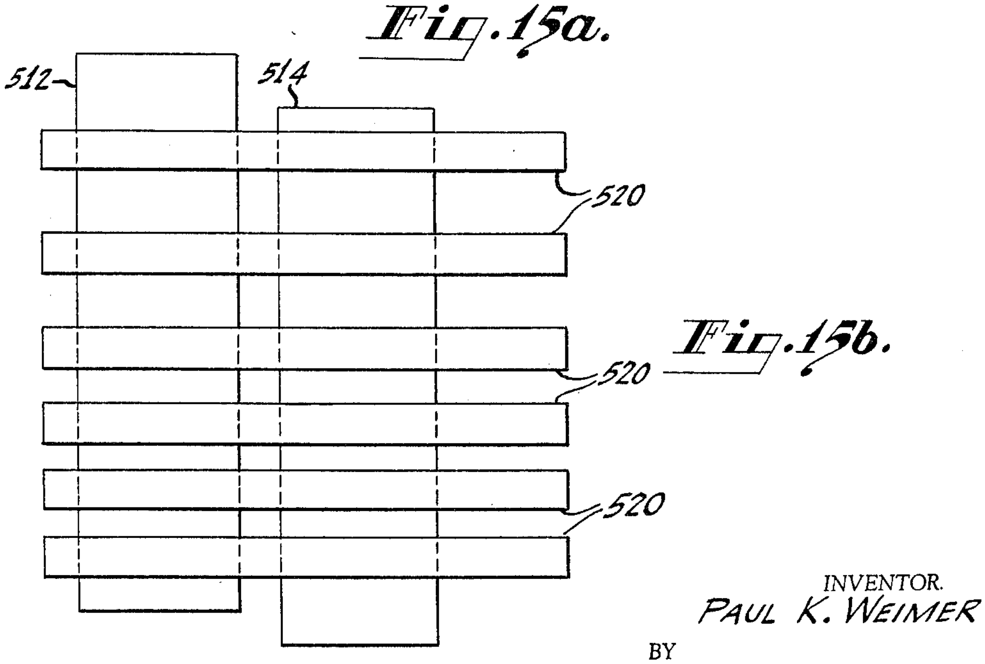

FIGURE 10*a* is a plan view of an integrated circuit comprising N-type thin film transistors and P-type tellurium thin film transistors;

FIGURE 10*b* is the equivalent circuit of the device illustrated in FIGURE 10*a*;

FIGURE 11 is a plan view of another integrated circuit comprising both N-type thin film transistors and P-type tellurium thin film transistors;

FIGURE 12 is the equivalent circuit of the device illustrated in FIGURE 11;

FIGURES 13–15*a* are cross-sectional views of computer logic elements formed of thin film devices embodying the invention; and, FIGURE 15*b* is a plan view of the electrodes in the device of FIGURE 15*a*.

Similar reference numerals have been applied to similar elements in the drawing.

*Example 1*

Figure 1A:
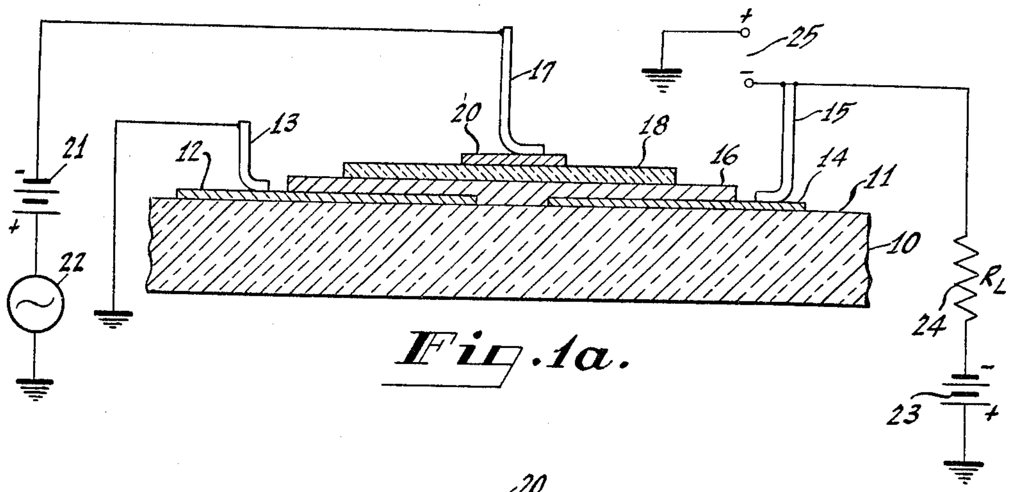

Referring now to FIGURE 1*a*, a solid state electrical device comprises an insulating support or substrate 10. The substrate 10 may be inorganic, such as a plate of glass, ceramic, fused quartz, or the like; alternatively, the substrate may be organic, such as a synthetic resin or plastic or flexible polymer. In this example, the insulating support 10 consists of glass. On one face 11 of substrate 10, two spaced electrodes 12 and 14 are deposited. Electrodes 12 and 14 suitably may consist of metals such as indium, copper, gold, and the like, and may be deposited as thin films by masking and evaporating techniques. Alternatively, a paste containing metallic particles may be painted or silk screened on the desired portions of one face 11 of support 10. Other techniques, such as sputtering, may also be utilized to deposit the spaced electrodes 12 and 14 as thin films. In this example, the spaced electrodes 12 and 14 consist of gold, and are deposited by any convenient method, such as the masking and evaporation techniques described below. The separation or gap between the spaced electrodes 12 and 14 is preferably less than 100 microns, and advantageously is of the order of 0.1 to 20 microns. The length of electrodes 12 and 14 is not critical. In this example, electrodes 12 and 14 are each 100 mils long.

A layer of semiconductive crystalline tellurium is then deposited on the aforesaid face 11 of insulating support 10 so as to cover a portion of the two spaced electrodes 12 and 14 and the space between them. The tellurium layer 16 is less than one micron thick. Preferably, the tellurium layer 16 is suitably betyeen 50 and 1500 Angstroms thick. The thickness of the tellurium layer 16 can be gauged by measuring the percentage of incident light transmitted through the film, or by other well-known means.

An insulating film 18 is deposited on at least a portion of the semiconductor layer 16. Materials such as silicon monoxide, silicon dioxide, calcium fluoride, aluminum oxide, zinc sulfide, and the like may be utilized for this film 18. For efficient operation, the insulating film 18 is preferably less than one micron thick. Advantageously, the insulating film 18 is between 100 and 1500 Angstroms thick.

Figure 1B:
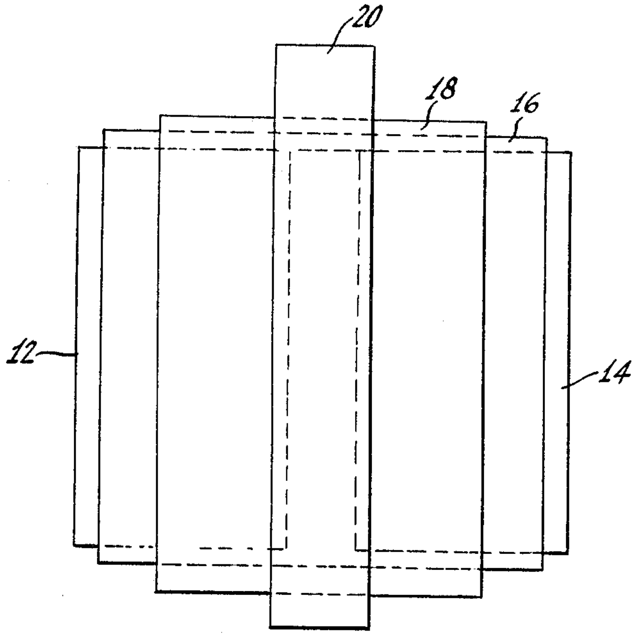

A gate or control electrode 20 is deposited on the insulating film 18 opposite the gap or separation between the two spaced electrodes 12 and 14, as shown in FIGURE 1*b*. The control electrode 20 may suitably be a metallic contact, and may consist of an alloy or metal such as gold, aluminum, and the like, and may, for example, be deposited on insulating film 18 by masking and evaporation techniques. Electrical lead wires 13, 15 and 17 may be respectively attached, for example, by means of a metallic paste such as silver paste, to those portions of the two spaced electrodes 12 and 14 not covered by the tellurium layer 16, and to the control electrode 20.

The device of the example may be utilized as an amplifier by incorporation in a suitable circuit, such as that shown in FIGURE 1*a*. Control contact 20 is negatively biased by connecting lead wire 17 to the negative terminal of a voltage source, for example, to the negative pole of a bias supply such as battery 21. The input voltage of the device is supplied by a grounded signal generator connected to the positive pole of battery 21. One of the two spaced electrodes 12 and 14 is grounded. In this example, electrode 12 is grounded. Lead wire 15 to electrode 14 is attached to a supply voltage, for example, to the negative pole of a battery 23. The positive pole of battery 23 is grounded. A load resistance 24 is inserted between the negative pole of battery 23 and electrode 14. The output voltage may be obtained across terminals 25, that is, between lead wire 15 and the ground.

The device of the example, utilizing evaporated gold for electrodes 12, 14 and 20, and evaporated silicon monoxide for the insulating film 18, was operated with the control electrode 20 at a negative bias of about 1 to 5 volts. The A.C. voltage gain of the device may be defined as the ratio of the output voltage to the input voltage. For input signals of about 50 millivolts, the device of this example with a gap or separation between electrodes 12 and 14 of about 15 microns exhibits voltage gains as high as 50.

The electrodes 12, 14 and 20, the semiconductive tellurium layer 16, and the insulating film 18 may all be deposited as thin films by evaporation or other suitable techniques. Since various methods are known for the programmed control and monitoring of the deposition of successive layers of materials, for example, by evaporation techniques, the devices of this embodiment may be economically mass produced by automated equipment.

An advantage of the device is that the semiconductive tellurium layer may be deposited on an insulating substrate without heating the substrate. As a result, insulating supports may be utilized having a low melting point, for example organic plastics, resins and polymers.

Moreover, a rectifying barrier such as a p-n junction is not required in the semiconductive tellurium layer. The device operates by field effect control of majority charge carriers. The electrode 12 which is grounded may be termed the anode or source electrode, the negatively biased electrode 14 may be termed the cathode or drain electrode (because the tellurium is P-type and the majority carriers are drawn to the drain electrode), and the insulated contact 20 may be termed the control or gate electrode. In this embodiment of the invention, the source electrode 12 and the drain electrode 14 are both ohmic connections to the semiconductive tellurium layer 16. The control electrode 20 forms an insulated coupling through the insulating film 18 to the semiconductive tellurium layer 16. The insulated coupling is blocking in both directions. In contrast, field effect devices such as unipolar transistors and double base diodes require the formation of a p-n junction in a body or layer of semiconductive material.

Furthermore, most solid state devices require monocrystalline semiconductive material, whereas, in contrast, the semiconductive tellurium in the devices described herein may be polycrystalline.

The semiconductive layer 16 can be made very uniform as to its composition and properties, since tellurium is an element. Devices wherein the semiconductive material is a compound are more difficult to prepare in a pure and stoichiometric form than devices in which the semiconductor is an element.

The high mobility of carriers in the semiconductive tellurium is advantageous in the device. As a result of its high mobility and narrow energy gap, the semiconductive tellurium is at least three orders of magnitude more conductive than previously utilized semiconductive compound materials such as cadmium sulfide and cadmium selenide. Higher values of transconductance are therefore possible in tellurium than have been observed with cadmium sulfide.

The P-type than film transistor of the device is superior to other P-type thin film transistors and can be combined on a single substrate with N-type thin film transistors to form integrated circuits whose characteristics are superior for certain purposes to circuits having transistors of only one type, or to integrated thin film transistor circuits of two types made with prior P-type devices.

In the device of Example I, the semiconductive tellurium layer 16 is of P-type conductivity, so that the flow of current through the tellurium layer is a flow of holes from the source or anode to the drain or cathode. Under these conditions, a negative bias may be used on the control electrode 20. If the tellurium layer 16 is doped to be of N-type conductivity, then the flow of current through the layer is a flow of electrons from the cathode, which is now the source electrode, to the anode, now the drain electrode, and a positive bias may be used on the control electrode.

In the operation of the device illustrated in FIGURE 1, the combination of the control electrode 20, the insulating film 18, and the semiconductive tellurium layer 16 acts as a parallel plate condenser. When the negative bias is applied to the control electrode 20 by the battery 21, the negative charge carrier layer on the control electrode 20 attracts an equal positive charge layer on the portion of the surface of tellurium layer 16 which is opposite control electrode 20. This positive charge layer consists of holes drawin into the tellurium layer 16 from the electrodes 12 and 14. These holes act as additional charge carriers to enhance the majority charge carrier current which passes through the tellurium layer 16 from source electrode 12 to drain electrode 14. Units according to this embodiment of the invention have given transconductance values up to 40,000 for an input capacitance of 120 micro-farads. The ratio of the transconductance to the drain current of the device is about 5000 micromhos per milliampere.

The gain-bandwidth product (G.B.) of the device may be calculated from the equation $$G.B.=\frac{g_m}{2\pi C_g}=\frac{\mu(V_g-V_o)}{2\pi L^2}$$

where $g_m$ is the transconductance of the unit,
$C_g$ is the capacitance across the insulating film, $\mu$ is the charge carrier drift mobility in the tellurium layer,
$V_g$ is the gate voltage,
$V_o$ is the gate voltage required for the onset of drain current,
and,
L is the distance or gap between the source and drain electrodes.

Measurements of the frequency and capacitance and transconductance of devices according to the invention indicate gain-bandwidth products of over 10 megacycles. For example, one unit exhibited a transconductance of about 40,000 $\mu$-mhos with a zero bias gate capacitance of about 120 picofarads. Assuming that the rise of capacitance with gate bias is negligible, the gain-bandwidth product of this device can be calculated as $$G.B.=\frac{g_m}{2\pi C_g}=\frac{40{,}000\cdot 10^{-6}}{2\pi 85\cdot 10^{-12}}=75 \text{ mc.}$$

In the above example, $C_g$ is taken as the useful channel capacitance, that is, the capacitance remaining after subtracting the unnecessary capacitance due to the gate overlap of the source and drain.

Figure 9:
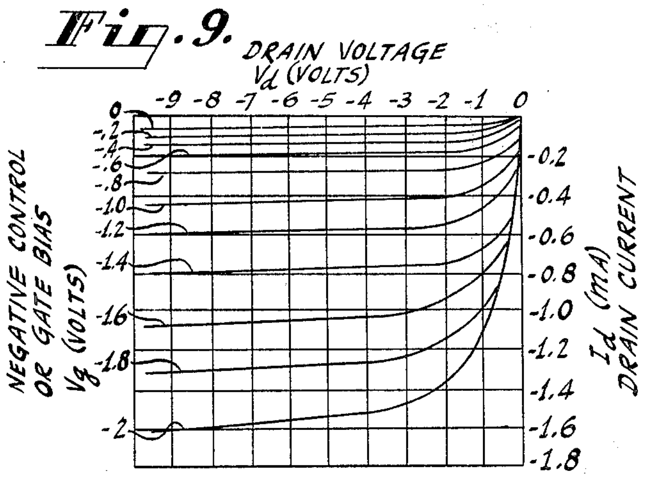
FIGURE 9 is a plot of the current-voltage curve for the device of FIGURES 1*a* and 1*b*.

FIGURE 9 is a plot of current versus voltage between the input (anode) and output (cathode) electrodes for a device according to this embodiment operating in the current enhancement mode. The ordinate indicates output or drain current as a function of the output or drain voltage for different values of negative bias on the control electrode. Throughout the normal range, the control electrode draws substantially no current. The control electrode current is smaller than the output current by several orders of magnitude. It will be noted that with increasing magnitude of negative bias on the control electrode the output current increases slowly at first and then more rapidly. The transconductance of this unit at high gate bias, for example, about −2 volts, is about 1600 micro-mhos, and the voltage amplification factor is about 100. Power gains of about 5000 have been obtained from devices according to this embodiment. No effects on the frequency response at high frequencies have been noted which can be related to the rates of filling or emptying of surface states or traps.

Figure 2:
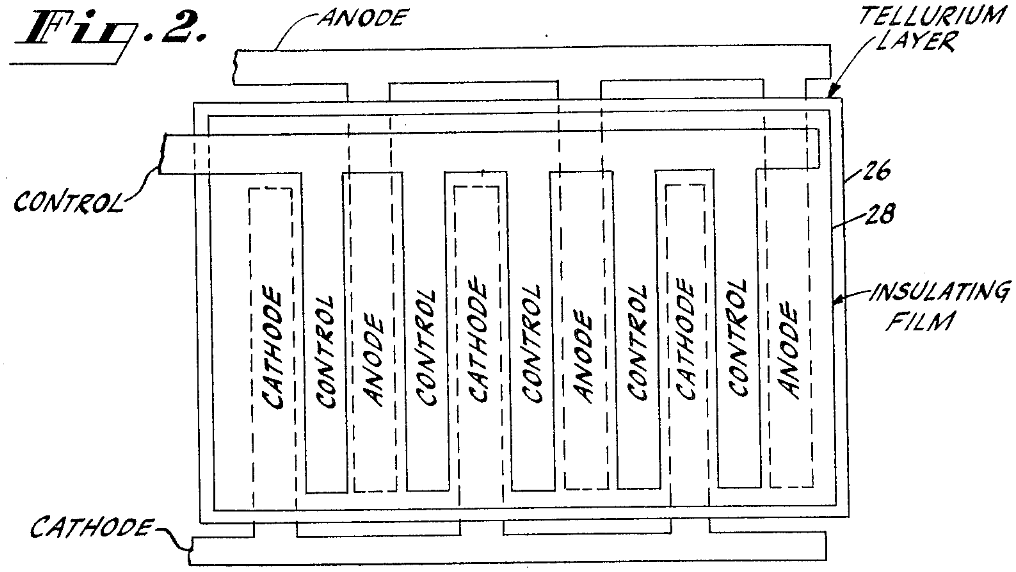
FIGURE 2 is a plan view of another solid state electrical device embodying the invention.

For greater clarity, lead wires have not been shown in the plan views of FIGURES 1*b* and 2, nor in FIGURES 3–8, but it will be understood that each device is completed by attaching lead wires when desired to the required electrodes.

*Example II*

In another embodiment of the invention the anode, cathode, and control electrodes are prepared with a comb-like interdigitated structure, as shown in FIGURE 2. A layer of crystalline semiconductive tellurium is deposited on an insulating support or substrate. An insulating film 28 is deposited on a portion of one face of the tellurium semiconductive layer 26 by any convenient technique, such as masking and evaporation. The comb-like anode and cathode electrodes are applied to that face of tellurium layer 26 which is opposite the insulating film 28. The anode and cathode electrodes may consist of a metal such as gold and the like, and may be deposited by evaporation as described above. The control electrode may be of metal similarly applied to the insulating film 28 so that each finger of the control electrode is over the gap or separation between adjacent fingers of the anode and cathode electrodes. An advantage of this embodiment is that the increased size of the electrodes permits increased power handling capabilities.

*Example III*

Figure 3:
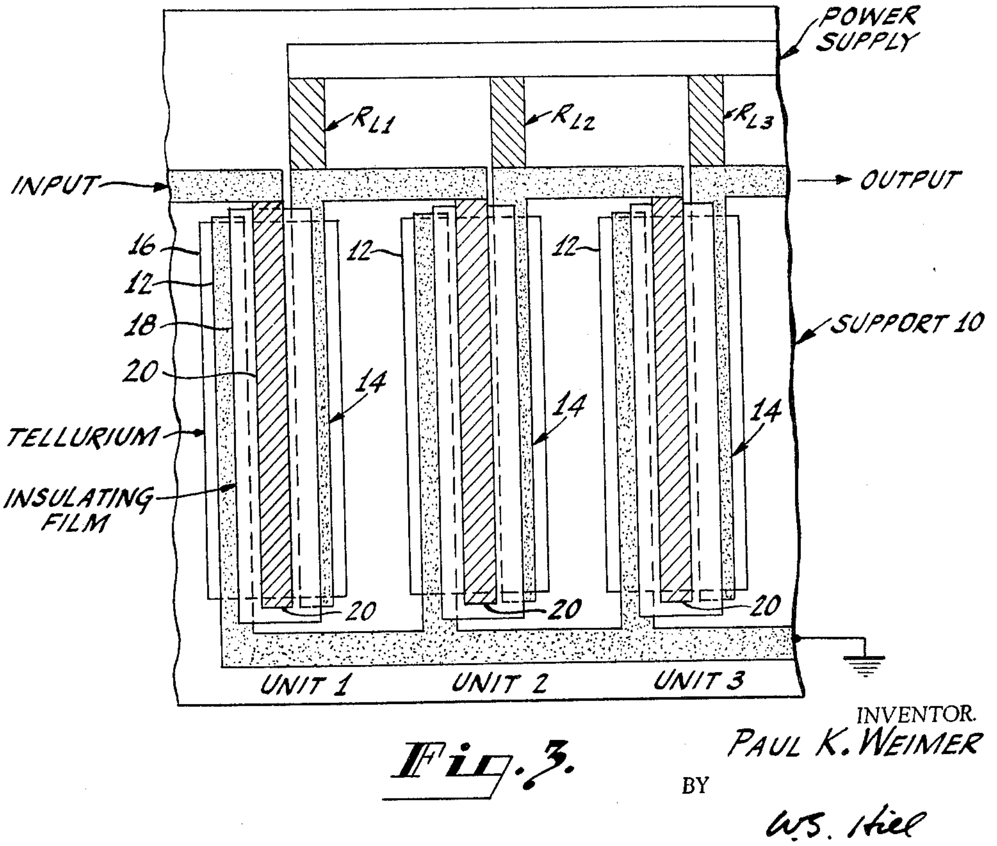
FIGURE 3 is a plan view of a multiple array of solid state electrical circuit elements embodying the invention, and connected in cascade on a single substrate.

A plurality of tellurium thin film triodes may be deposited on a single insulating substrate as illustrated in FIGURE 3. Suitable masking and evaporation techniques are utilized as described above to deposit on an insulating support 10 a plurality of cathode electrodes 12, a plurality of anode electrodes 14, a semiconductive, crystalline tellurium layer 16 over the cathode and anode electrodes, an insulating film 18 on at least a part of the crystalline tellurium layer 16, and a plurality of control electrodes 20 on the insulating film 18. Each control electrode 20 is preferably positioned opposite the gap or separation between a cathode electrode 12 and an anode electrode 14. The individual triodes thus fabricated may be interconnected as desired, for example, in cascade, so that the output of one triode may be used to drive other triodes. In the device illustrated, there are three separate units interconnected in cascade so as to be operable as a three-stage amplifier. $R_{L1}$, $R_{L2}$ and $R_{L3}$ are strips of evaporated resistive material such as nichrome which serve as the load resistors for each triode.

*Example IV*

Figure 4:
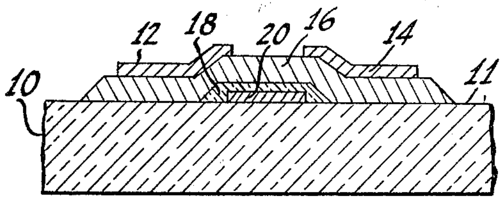
FIGURES 4–8 are cross-sectional views of five other devices, each embodying the invention.

Another embodiment of the invention is illustrated in FIGURE 4. The field effect device of FIGURE 4 comprises an insulating substrate or support 10, a metal control electrode 20 on one face 11 of support 10, an insulating film 18 over a portion of face 11 and electrode 20, a layer 16 of crystalline semiconductive tellurium on insulating film 18, and metal cathode and anode electrodes 12 and 14 respectively on that face of the active tellurium layer 16 which is opposite the insulating film 18. As in the remaining embodiments, the insulating film 18 is preferably less than one micron thick. Suitably, the insulating film 18 is between about 100 and about 1500 Angstroms thick. The gap or separation between the cathode and anode electrodes 12 and 14 is preferably opposite the control electrode 20. In the device of this example, the arrangement of the cathode, anode and control electrodes with respect to the active tellurium layer and the insulating film is similar to that of the device illustrated in FIGURE 1*a*, but with the insulating substrate supporting the control side of the device. The outer embodiments of the invention described herein may similarly be fabricated by depositing the various layers in reverse orders.

*Example V*

Figure 5:
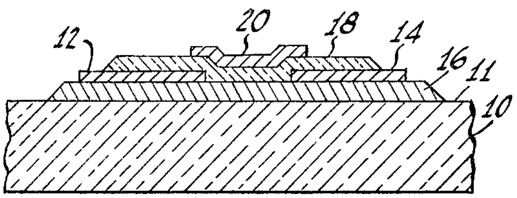
Figure 6:
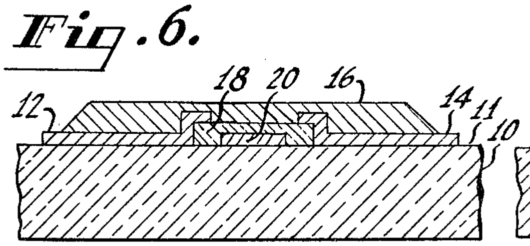

Still another embodiment of the invention is illustrated in FIGURE 5. The thin film triode of FIGURE 5 comprises an insulating support 10; a layer 16 of crystalline semiconductive tellurium on one major face 11 of support 10; cathode and anode electrodes 12 and 14 respectively spaced from each other on that face of tellurium layer 16 which is opposite the support 10; an insulating film 18 on a portion of tellurium layer 16 and electrodes 12 and 14; and a control electrode 20 on that face of insulating film 18 which is opposite the tellurium layer 16. The electrodes 12, 14 and 20 may, for example, consist of a metal such as gold and the like, deposited, for example, by evaporation, and are preferably arranged so that control electrode 20 is opposite the gap or separation between cathode electrode 12 and anode electrode 14. The device of this example differs from that of Example I in that in the latter, the cathode and anode electrodes are positioned between the substrate or support 10 and the tellurium layer 16; in the device of this example, the cathode and anode electrodes are positioned between the active tellurium layer 16 and the insulating film 18. All the electrodes of this embodiment are on the same side of the active tellurium layer 16, which is deposited first on the insulating support 10.

*Example VI*

In another embodiment of the invention, the three electrodes are also all on the same side of the active tellerium layer. The thin film triode shown in FIGURE 6 comprises an insulating support 10; a control electrode 20 on one major face 11 of substrate 10; an insulating film 18 over control electrode 20; a cathode electrode 12 and an anode electrode 14 spaced from each other on face 11 of the insulating support 10 positioned on opposite sides of the control electrode 20; and a layer 16 of crystalline semiconductive tellurium on at least part of electrodes 12 and 14, and on that part of insulating film 18 which is over the control electrode 20. The insulating substrate or support 10 may consist of glass, fused quartz, a ceramic, a synthetic resin, or the like; the insulating film 18 may consist of any of the materials such as silicon monoxide, calcium fluoride, aluminum oxide, and the like, mentioned in Example I; and the electrodes may consist of evaporated metal as described above. In the fabrication of the device of this example, the spaced electrodes 12 and 14 are conveniently deposited on the support 10 after the insulating film 18, so that the inner edges of electrodes 12 and 14 lie on film 18.

METHODS OF FABRICATION

As mentioned above, the thin films utilized in the device of the invention may be deposited by any convenient technique. While evaporation is presently the most useful method of depositing uniform thin films, other processes such as sputtering or plating may also be utilized.

It can be shown that the upper limit on high frequency performance for the devices described herein is related to the transit time for charge carriers moving in the active semiconductive tellurium layer between the cathode and anode electrodes. The transit time can be reduced either by increasing the mobility of the semiconductive tellurium layer, or by reducing the gap or spacing between the anode and cathode electrodes.

The narrow gap or separation between the cathode and anode electrodes can be precisely controlled in the following manner by a two-step evaporation process. A stretched wire held in a frame is utilized as an evaporation mask. The wire may, for example, be one mil thick. For high precision, the stretched wire is preferably untwisted, and has been drawn through a die. A metal such as gold is then evaporated on an insulating support maintained beneath the wire. The support may, for example, be a glass slide. After the first evaporation step, there are formed on one face of the glass slide two gold films with a gap one mil wide between them. The frame is now moved a short distance transversely to the gap and parallel to one face of the glass slide, by means of a precision screw. A second evaporation of gold on the glass slide is then performed. During the second evaporation, some gold is deposited on a portion of the gap position previously masked by the wire. The width of the gap can thus be reduced to an amount less than the diameter of the stretched wire used as the mask. A gap or separation of as little as one micron can be obtained between two evaporated electrodes in this manner. A frame holding a plurality of stretched wires may be utilized when a plurality of gaps is desired, as in the depoostion of an array of devices on a single substrate. The method depends on imparting relative motion between the wire mask and the support. It may also be performed by keeping the frame and stretched wire in a fixed position, and moving the support or substrate relative to the wire. Alternatively, both the wire and the support may be moved.

A method of forming a thin insulating film between a metal and a semiconductor will now be described. This method has been found useful in fabricating the insulating contacts which serve as control electrodes for the devices of the invention. It has been found that when aluminum is deposited slowly, for example, by evaporation under reduced atmospheric pressure onto a layer of semiconductive material, such as crystalline tellurium, a thin film of aluminum oxide can be formed. In order to form the oxide, the aluminum is deposited at a reduced pressure of about $10^{-4}$ to $10^{-5}$ mm. Hg of air. It is thought that during this evaporation, the aluminum molecules are able to combine with some of the oxygen molecules present and hence are deposited as aluminum oxide. To deposit the overlying conducting aluminum gate electrode, the vacuum system is pumped down to $10^{-5}$ mm. of Hg, or lower, and the aluminum is deposited rapidly.

The thin aluminum oxide film is capable of serving in the same manner as the silicon oxide or calcium fluoride films described above to prevent the flow of current in either direction between the aluminum electrode and the tellurium layer. An aluminum oxide film is also formed on that surface of the aluminum electrode which is exposed to the air, but does not hinder the operation of the device, since electrical lead wires are readily attached to the aluminum notwithstanding these exposed aluminum oxide surfaces, for example, by means of silver paste.

*Example VII*

Figure 7:
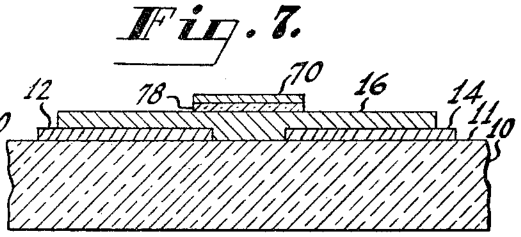

Another embodiment of the invention is illustrated in FIGURE 7. The field effect tellurium triode of the example comprises an insulating support 10; two closely spaced metallic electrodes 12 and 14 on one face 11 of support 10; and a layer 16 of active semiconductive tellurium over at least part of face 11 and electrodes 12 and 14. A control electrode 70 is prepared by evaporating aluminum directly on tellurium layer 16, so that the resulting electrode is opposite the gap or separation between cathode electrode 12 and anode electrode 14. As discussed above, it has been found that by evaporating the first part of the aluminum slowly in a poor vacuum and the last part rapidly in a high vacuum, a very thin insulating film of aluminum oxide 78 is formed between the aluminum control electrode 70 and the active tellurium layer 16. This insulating aluminum oxide film 78 may be as thin as 50 Angstroms thick but takes the place of the insulating film 18 in previous embodiments, and serves to prevent the control electrode 70 from injecting holes into the tellurium layer 16 or from extracting electrons from tellurium layer 16 when electrode 70 is negatively biased.

*Example VIII*

Figure 8:
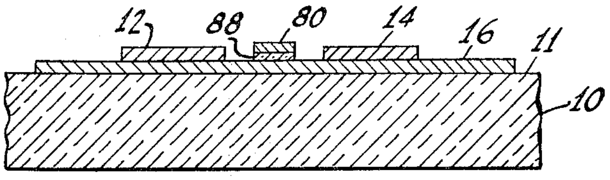

The thin film triode of this example has all three electrodes on the same side of the device, as illustrated in FIGURE 8. The triode comprises insulating support 10; a layer 16 of semiconductive tellurium on one major face 11 of support 10; a cathode electrode 12 and an anode electrode 14 on tellurium layer 16; and a control electrode 80 between the cathode electrode 12 and anode electrode 14. The cathode and anode electrodes may consist of an evaporated metal such as gold, which makes an ohmic contact with the tellurium. The control electrode 80 consists of evaporated aluminum. As in the previous example, a thin insulating film of aluminum oxide 88 is formed between the control electrode 80 and the active semiconductive layer 16. This insulating aluminum oxide film 88 serves in the same manner as the insulating film 18 of previous embodiments to prevent excess current flow between control electrode 80 and tellurium layer 16 when control electrode 80 is biased.

*Example IX*

Logic elements for computer building blocks may be made which embody the invention. One type of logic element is the "and" gate. The following examples show how thin film "and" gates may be fabricated embodying the invention.

A thin film "and" gate which operates in the current enhancement mode comprises a layer 360 of semiconductive tellurium deposited on one major face 310 of an insulating support 300, as illustrated in FIGURE 13. Two outer spaced metallic electrodes 312 and 314 are deposited on the active tellurium layer 360. Electrodes 312 and 314 may, for example, consist of gold and may be deposited by evaporation. Two inner spaced electrodes or gates 317 and 319 insulated from the semiconductive layer 360 are formed in the gap or space between electrodes 312 and 314. The two electrodes 317 and 319 may consist of aluminum deposited by evaporation in air under reduced atmospheric pressure so that thin insulating aluminum oxide films 318 and 320 are formed beneath electrodes 317 and 319 respectively. Alternatively, two spaced insulating films 318 and 320 of an insulating material such as silicon oxide or calcium fluoride or the like may be deposited in the gap between electrodes 312 and 314. Then two gold films 317 and 319 are deposited on insulating films 318 and 320 respectively.

The device thus formed may be operated as a simple "and" gate with two inputs. A voltage may be applied between electrodes 312 and 314 with one of them negative and the other positive. Both input gates 317 and 319 are negatively biased with respect to the positive one of the electrodes 312 and 314 in order for current to flow between the cathode electrode 312 and the anode electrode 314. Another form of this "and" gate with two input gates may be fabricated by forming the two insulated contacts 317 and 319 on opposite sides of the semiconductive tellurium layer. If either or both of the input gates 317 and 319 are at zero bias or positively biased with respect to the positive one of electrodes 312 and 314, there is substantially no current flow between the electrodes 312 and 314. Therefore, the device may act as an "and" circuit or gate.

*Example X*

A multiple input "and" gate may be fabricated by a series of five evaporation steps as illustrated in FIGURE 14. The device comprises an insulating support 400 having a plurality of spaced electrodes deposited on one major face 410 of the support. In this example, four spaced electrodes 412, 413, 414 and 415 are deposited on one major face 410 of insulating substrate 400. These electrodes may all consist of a metal such as gold and the like, and may be deposited simultaneously, for example, by a single evaporation step. Next, a first insulating film 417 of a material such as silicon monoxide, calcium fluoride, or the like, is evaporated over at least part of the two electrodes 413 and 415. In the third evaporation step, a layer 416 of semiconductive tellurium is deposited on at least part of the electrodes 412 and 415, on part of support face 410, and on the insulating film 417. In the fourth evaporation step, a second film 418 of insulating material such as zinc sulfiide, calcium fluoride, silicon monoxide, or the like, is deposited on at least part of the tellurium layer 416. The fifth evaporation is the deposition of a plurality of metallic electrodes on the second insulation film 418. Metals such as gold or aluminum are suitable for these electrodes. In this example, three such electrodes 401, 403 and 405 are deposited on an insulating film 418 opposite the gaps between electrodes 412, 413, 414 and 415. Each of electrodes 401, 403, 413 and 415 are separated from the tellurium layer 416 by an insulating layer or film. Accordingly, when a steady current is passed between electrodes 412 and 414, a negative bias is required on each of the electrodes 401, 403, 405, 413, and 415, which serve as multiple input gates, in order to obtain an output current.

*Example XI*

A multiple input "or" gate embodying the invention is illustrated in FIGURES 15*a* and 15*b*.

In the "or" gate, the individual input gates control parallel conductive paths between the input and output electrodes of the device. The device comprises an insulating support 500 bearing on one major face 510 two spaced electrodes 512 and 514. Electrodes 512 and 514 are preferably deposited in the form of long, narrow parallel strips, as shown in the plan view of the device electrodes in FIGURE 15*b*. A layer of semiconductive tellurium 516 is deposited on at least part of electrodes 512 and 514. A film 518 of insulating material such as silicon oxide, calcium fluoride, and the like is deposited on at least part of tellurium layer 516. A plurality of metal electrodes 520 are then deposited on insulating film 518 transversely to electrodes 512 and 514. In this embodiment, as shown in the plan view FIGURE 15*b*, six control electrodes 520 are deposited, for example, by evaporation of gold or aluminum. It will be seen that the device of this embodiment can be fabricated by means of only four separate evaporation steps. Each of the six electrodes 520 is insulated from the semiconductive tellurium layer 516 by the insulating film 518. The device may be operated with electrode 514 as the anode (source), and electrode 512 as the cathode (drain). There is then a current passed between cathode electrode 512 and anode electrode 514. A negative biasing voltage with respect to the anode 514 may be applied to the electrodes 520 to enhance the cathode current passing between the cathode and anode electrodes of the device.

*Example XII*

If desired, in a device embodying the invention, P-type and N-type thin film transistors may be deposited on the same substrate and interconnected to form circuits utilizing each type of device to best advantage. An example of such a circuit, utilizing P-type tellurium thin film triodes and N-type cadmium sulfide thin film triodes will now be described.

The utilization of N-type thin film transistors and P-type tellurium thin film transistors in the fabrication of an integrated bistable flip-flop circuit, that is, a circuit which in operation assumes one or the other but not both of two stable states, is illustrated in plan view in FIGURE 10*a*, and its equivalent circuit is illustrated in FIGURE 10*b*. In the fabrication of this structure, a first layer of an N-type semiconductive material 250, such as cadmium selenide, cadmium sulfide, and the like, is deposited on a portion of the lower half (as viewed in FIGURE 10*a*) of the major surface of an insulating substrate 252. A second layer of P-type semiconductive material 254 is deposited on a portion of the upper half of the substrate 252 and separated from said first layer 250. In this example, the P-type semiconductive layer 254 consists of tellurium.

Two long, parallel strip electrodes 254 and 260 serve the junctions as drain and gate electrodes for four thin film triodes 262, 264, 266 and 268 (FIGURE 10*b*). Those portions of the electrodes 258, 260 which serve as gate electrodes and which are so designated in FIGURE 10*a* are separated from the associated semiconductive material 250 and 254 by regions of insulating material which may be wider in extent than the electrodes 258 and 260 themselves. Remaining portions of these electrodes 258, 260 serve as drain electrodes, and are deposited on the semiconductive materials 250 or 254. The ends of these electrodes 258 and 260 extend beyond the semiconductive material and may be deposited on the insulating substrate 252. Third and fourth short metallic electrodes 272 and 274 are deposited on top of the layer of N-type material 250 adjacent those portions of electrodes 260 and 258 designated "$G_1$" and "$G_2$," respectively. Fifth and sixth short, metallic electrodes 276 and 278 are deposited on top of the layer of P-type semiconductive tellurium 254 adjacent the portions of electrodes 258 and 260 which are designated "$G_3$" and "$G_4$," respectively. The latter four electrodes 272, 274, 276 and 278 are source electrodes for the thin film triodes 262, 264, 266 and 268 respectively (FIGURE 10*b*).

A flip-flop of the type illustrated in FIGURE 10 has the advantage that it remains in either stable state without drawing any appreciable current when the semiconductive materials 250 and 254 are made so that the triodes 262, 264, 266 and 268 draw very little current at zero bias. Triodes 262 and 264 may be considered the cross-coupled active devices of the flip-flop. Triodes 266 and 268 operate as variable impedance elements serving the function of load resistors in the basic flip-flop circuits, and enhancing the operation of the flip-flop in a manner to be described.

A semiconductive material which has a large number of unfilled traps at zero gate-to-source bias has a high impedance between source and drain. In insulated gate field effect devices, when the gate is made more positive in potential than the source, for N-type semiconductive material, electrons are drawn into the semiconductive layer, and the impedance between source and drain is lowered. If the semiconductor is P-type, for example, P-type tellurium as in this embodiment holes are drawn into the material when the gate voltage is made negative in relation to the source voltage. The gate-to-source voltage differential at which substantial filling of traps and consequent lowering of impedance occurs, is a function of the doping, and can be controlled. Moreover, the impedance between source and drain for a given material is a function of the gate bias. In this sense, the triode acts somewhat as a switch, with the metallic gate electrode functioning to open and close the switch by controlling the conductivity of the path between the source and drain.

Consider now the operation of the flip-flop and assume that the source electrodes of triodes 262 and 264 are grounded, and that the source electrodes of triodes 266 and 268 are connected directly to a voltage supply of +5 volts with respect to ground. Assume further that the impedance between source and drain of a triode remains very high until the gate-to-source voltage differential exceeds one volt. Initially, the triode 262 may be in the low impedance state by virtue of having been so triggered from an external source. The impedance between source $S_1$ and drain $D_1$ of this triode then is low, and the drain $D_1$ voltage may be +1 volt. This voltage applied to the gate $G_2$ of triode 264 is insufficient to lower the impedance appreciably between source $S_2$ and drain $D_2$.

The impedance between drain $D_3$ and source $S_3$ drops to a low value because the gate $G_3$ is four volts negative relative to the source $S_3$. (The semiconductive material of triode 266 is P-type tellurium.) Accordingly, the voltage drop between source $S_3$ and drain $D_3$ may be only about one volt, and the drain $D_3$ voltage is +4 volts. This voltage applied at the gate $G_1$ of triode 262 keeps this triode in a state of low impedance. The +4 volts applied at the gate $G_4$ of triode 268, however, results in a voltage differential of only one volt between source $S_4$ and $G_4$. Accordingly, the impedance between source $S_4$ and gate $G_4$ is high.

In summary, triodes 262 and 266 are in their low impedance states, and the triodes 264 and 268 are in their high impedance states. The only paths for current flow through the triodes 262 and 266 are through the drain-source paths of triodes 268 and 264 respectively. Because of the high impedance of these paths, little current flows through the triodes 262 and 266, and the steady state power dissipation is very low. The flip-flop may be switched to its other stable state by applying its voltage signal at the gate $G_3$ of triode 264, for example. The flip-flop then reverses state, with triodes 262 and 266 in the high impedance state and triodes 268 and 264 in the low impedance state.

*Example XIII*

Another embodiment of the invention utilizing P-type tellurium thin film transistors and N-type thin film transistors in a single integrated circuit will now be described.

FIGURE 11 is a plan view of four stages of an evaporated, integrated shift register, each stage of which employs a flip-flop of the type illustrated in FIGURE 10*a*. FIGURE 12 is an equivalent circuit diagram of the four stages. In FIGURE 11, resistors, capacitors and diodes are denoted by the letters "L," "C" and "D," respectively, with numerical subscripts corresponding to the reference characters of FIGURE 12. All of these components and the cross-overs of connecting lines may be fabricated in the manner described previously. The entire structure is supported on an insulating substrate 290.

The semiconductive materials 292 and 294 of each flip-flop are deposited on the top surface of the substrate 290. The N-type semiconductor 292, and the P-type semiconductive tellurium for the left-most flip-flop only, are outlined in FIGURE 11. The pattern of semiconductive material is similar for the other flip-flops. The semiconductive material extends only a portion of the way across the width of the source S and drain D electrodes. This allows close spacing of the electrodes in the horizontal direction, while assuring that there is no coupling between the drain electrode D of one stage and the source electrode S of the next adjacent state, $D_1$ and $S_5$, for example. A region of insulating material is interposed between each of the gate electrodes G and the semiconductive material 292 and 294.

All critical gaps in the layout arrangement of FIGURE 11 are parallel to the output electrodes 296, 298, 300 and 302, thus permitting construction using the masking wire technique described above. Geometrical layouts which permit all critical dimensions of the pattern to be determined by parallel masking wires in an evaporator yield a compact evaporated circuit. Extreme compactness is desirable in applications such as shift registers, memory arrays, and scanning circuits for solid state television and pickup display panels. The flip-flops of FIGURES 10 and 11 are particularly well adapted to the thin film triode construction in which all of the electrodes are located on the same surface of the semiconductive material.

The above examples are by way of illustration only, and not limitation. If desired, devices according to the invention may be deposited on both of the opposing major faces of an insulating substrate or support. Various other modifications may be made without departing from the spirit and scope of the invention as described in the specification and appended claims.

What is claimed is:

1. A solid state device comprising:
an insulating substrate;
a layer of semiconductive tellurium, said layer having a thickness less than one micron;
at least two spaced electrodes on said layer, said space between said electrodes being less than 100 microns;
an insulating film less than one micron thick on at least a portion of said tellurium layer;
and at least one electrode on said insulating film extending over at least part of the gap between said two spaced electrodes.

2. A solid state device comprising:
an insulating support;
a layer of crystalline semiconductive tellurium on one face of said support, said layer having a thickness less than one micron;
at least two spaced metallic electrodes on said tellurium layer, said space between said electrodes being less than 100 microns;
a film less than one micron thick of a material selected from the group consisting of calcium fluoride, silicon monoxide, silicon dioxide, aluminum oxide and zinc sulfide on at least a portion of said tellurium layer;
and at least one metallic electrode on said film extending over at least part of the gap between said spaced electrodes.

3. A solid state device comprising:
an insulating support;
a layer of crystalline tellurium on one face of said support, said layer having a thickness less than one micron;
at least two metallic electrodes on said tellurium layer, said electrodes having a gap of less than 100 microns therebetween;
a film of silicon oxide less than one micron thick on at least a portion of said tellurium layer;
and at least one metallic electrode on said silicon oxide film extending over at least part of said gap.

4. A solid state device comprising:
an insulating support;
a layer of crystalline semiconductive tellurium on one face of said support, said layer having a thickness less than one micron;
two comb-like interdigitated metallic electrodes on the same side of said tellurium layer;
an insulating film less than one micron thick on at least a portion of the opposite side of said tellurium layer;
and a metallic electrode on said insulating film.

5. A thin film device comprising:
an insulating support;
at least two spaced metallic electrodes having a gap of less than 100 microns therebetween on one major face of said support;
a layer of semiconductive tellurium upon at least a portion of said one face of said support and upon said electrodes, said layer having a thickness less than one micron;
an insulating film less than one micron thick upon at least a portion of the side of said tellurium layer opposite said support;
and at least one metallic electrode on said insulating film extending over at least part of said gap.

6. A thin film triode comprising:
an insulating support;
a first metallic electrode upon one major face of said support;
an insulating film less than one micron thick upon at least a portion of said electrode and said one face;
a layer of semiconductive tellurium less than one micron thick upon said insulating film;
and two spaced metallic electrodes having a gap of less than 100 microns therebetween upon the side of said tellurium layer opposite said insulating film, said gap being opposite said first electrode.

7. A thin film triode comprising:
an insulating support;
a layer of semiconductive tellurium less than one micron thick upon one face of said support;
two spaced metallic electrodes having a gap of less than 100 microns therebetween upon the side of said tellurium layer opposite said support;
an insulating film less than one micron thick upon said side of said semiconductive layer, and upon at least a portion of said two spaced electrodes;
and a third metallic electrode upon said insulating film extending over at least part of said gap.

8. A solid state device comprising:
an insulating support;
a layer of semiconductive tellurium about 50 to 1500 Angstroms thick on one face of said support;
two spaced metallic electrodes on said tellurium layer, said spaced electrodes having a gap of about 0.1 to 20 microns therebetween;
an insulating film about 100 to 1500 Angstroms thick on at least a portion of said tellurium layer;
and at least one metallic electrode on said film extending over at least part of the gap between said spaced electrodes.

9. A thin film triode comprising:
an insulating support;
two spaced metallic electrodes having a gap of less than 100 microns therebetween upon one face of said support;
a layer of semiconductive tellurium less than one micron thick upon at least a portion of said two spaced electrodes and said one support face;

and an aluminum electrode upon the side of said tellurium layer opposite said support, said aluminum electrode extending over at least part of said gap and having an aluminum oxide film less than one micron thick between said electrode and said tellurium layer.

10. A thin film triode comprising:
an insulating support;
a layer of semiconductive tellurium less than one micron thick upon one face of said support;
two spaced metallic electrodes upon the side of said tellurium layer opposite said support, said space between said electrodes being less than 100 microns;
and an aluminum electrode between said two spaced electrodes, said aluminum electrode having an oxide film less than one micron thick between said electrode and said semiconductive layer.

11. A solid state device comprising:
an insulating substance;
a layer of semiconductive tellurium less than one micron thick on said substrate;
at least two spaced metallic electrodes on said tellurium layer, said space between said electrodes being less than 100 microns;
an insulating film on at least a portion of said layer, said film being less than one micron thick;
and at least one metallic electrode on said film extending over at least part of the gap between said spaced electrodes.

12. A thin film circuit element comprising:
an insulating support;
a layer of semiconductive tellurium upon one face of said support, said layer having a thickness less than one micron;
two outer metallic electrodes upon the side of said tellurium layer opposite said support;
at least two spaced inner metallic electrodes within the gap between the two outer electrodes; the lateral space between any two adjacent electrodes being less than 100 microns;
and an insulating film between said inner electrodes and said tellurium layer, said film having a thickness less than one micron.

13. A thin film circuit element comprising:
an insulating support;
first and second spaced metallic electrodes having a gap of less than 100 microns therebetween upon one face of said support;
a layer of semiconductive tellurium upon at least a portion of said first and second electrodes and said one major face, said layer having a thickness less than one micron;
an insulating film less than one micron thick upon at least a portion of said tellurium layer;
and a plurality of spaced metallic electrodes upon the side of said insulating film opposite said tellurium layer and transverse to said first and second electrodes.

References Cited by the Examiner

UNITED STATES PATENTS 3,191,061 6/1965 Weimer ------------ 317—235

JOHN W. HUCKERT, *Primary Examiner.*

M. EDLOW, *Assistant Examiner.*